United States Patent [19]

Palara et al.

[11] Patent Number: 4,682,120

[45] Date of Patent: Jul. 21, 1987

[54] SHORT CIRCUIT PROTECTION DEVICE FOR AN INTEGRATED CIRCUIT AND A LOAD CONNECTED THERETO

[75] Inventors: Sergio Palara, Bareggio; Aldo Torazzina, Monza, both of Italy

[73] Assignee: SGS Microelettronica S.p.A., Milan, Italy

[21] Appl. No.: 655,338

[22] Filed: Sep. 27, 1984

[30] Foreign Application Priority Data

Sep. 27, 1983 [IT] Italy ............................. 23003 A/83

[51] Int. Cl.$^4$ ............................................. H03F 21/00
[52] U.S. Cl. ............................ 330/298; 330/146;
330/207 P; 361/79; 361/88; 361/101
[58] Field of Search ............ 330/146, 207 P, 298,
330/307; 361/79, 86, 87, 88, 93, 101

[56] References Cited

U.S. PATENT DOCUMENTS 3,792,316  2/1974  Bondini et al. ..................... 361/79
3,990,020  11/1976  Porter, III ......................... 330/207 P
4,368,436  1/1983  Palara et al. ....................... 330/207 P Primary Examiner—James B. Mullins
Attorney, Agent, or Firm—Harry M. Weiss & Associates

[57] ABSTRACT

A short circuit protection device for a unitary voltage gain signal transducer circuit ($G_v$) and for a load impedance ($R_L$) coupled to the transducer circuit includes a first ($A_1$) and a second ($A_2$) threshold comparator circuit and an actuator circuit (ACT). The input terminals of the first comparator ($A_1$) are coupled to the transducer circuit input and output terminals and the output terminal of the first comparator is coupled to an activation terminal of the actuator circuit. The input terminals of the second comparator ($A_2$) are coupled to the ends of the load impedance and the output terminal is coupled to an inhibit terminal of the actuator circuit. A first output terminal of the actuator circuit is coupled to an inhibit terminal of the transducer circuit, while a second output terminal of the transducer circuit is used to deliver a small current $I_1$ to the load impedance.

20 Claims, 3 Drawing Figures

SHORT CIRCUIT PROTECTION DEVICE FOR AN INTEGRATED CIRCUIT AND A LOAD CONNECTED THERETO

BACKGROUND OF THE INVENTION

The present invention relates generally to electronic devices for protection against short circuits in circuits containing semiconductor power elements. In particular, the semiconductor circuits to be protected include unitary voltage gain signal transducer circuits such as the final stages of audio power amplifiers or voltage regulators.

A state-of-the-art protection device is described, for example, in U.S. Pat. No. 3,792,316, assigned to the assignee of the instant U.S. patent Application. This protection device, normally used to protect the final power element of a monolithically integrated amplifier circuit, includes circuit means to read and analyze the value of the current flowing through the power element itself and the value of the voltage at selected terminals of the power element. The information thus obtained on the instantaneous power dissipated by the power element is used to activate, when certain power values are reached, a threshold circuit which reduces the current in the element itself to a maximum value which is a function of the voltage value present at the selected terminals. As soon as this power, due to an accidental overload such as a short circuit at the output terminal, reaches dangerous levels for the power element, the protection circuit is activated keeping the dissipated power within safety limits defined by a characteristic curve of the transistor itself.

The protection devices of the kind described above perform very well the task of preventing the destruction of an integrated circuit power element due to accidental overload. However, they do not prevent the components from working at maximum permissible power during the entire time of overload conditions.

However, since the users of integrated circuits with power elements generally, for economic reasons, select the external power sinks for discharging the heat created by such elements according to normal operating condition requirements, under conditions of prolonged short circuit, a danger continues, in spite of the protection, both of damaging the integrated circuit and of overheating the whole apparatus of which the circuit is a part, with consequent heavy damage to the structures adjacent to the apparatus itself.

On the other hand, it is not advantageous to decrease the maximum level of current in the power element by lowering the protection intervention threshold, because the dynamic performance of the circuit would be unnecessarily limited under normal operating conditions.

A typical example where the above-mentioned protection devices prove to be insufficient relates to audio amplifiers which are mounted in motor vehicles, there being a large short circuit risk because the "ground" is the vehicle itself. Therefore, as soon as the electrical connecting cables touch a metal part of the car because of carelessness during installation or defects in insulation, they can cause a short circuit and therefore a high flow of current through the power element, the load impedance, or both. An accidental short circuit, if not immediately eliminated, will not only cause the car battery to quickly discharge, but can also cause a fire.

A second type of a state-of-the-art protection device, described in the U.S. Pat. No. 4,368,436 assigned to the assignee of the instant U.S. Patent Application protects against overloading unitary voltage gain signal transducer circuits, such as the final stages of audio amplifiers. This protection device limits its operation to short circuit conditions and requires a negligible power dissipation for the protected device.

This protection device includes a threshold comparator, whose first and second terminals are coupled respectively to the signal input terminal and to the transducer circuit output terminal, and whose output terminal is coupled to a transducer circuit inhibit terminal. The threshold of the comparator is adjusted in such a way that the comparator generates, at the output terminal, a signal inhibiting the transducer circuit when the difference between input and output voltage of such circuit exceeds a predetermined value, as is the case with a short circuit at the output terminal.

The threshold voltage value is chosen in relation to the maximum dissipation physically allowable for the power components and the characteristics of normal load.

The restoration of the comparator initial conditions after the overload conditions have been eliminated, in order for the transducer circuit to return to normal operation, can be automatic or can be controlled manually. The restoration is obtained by increasing the transducer output voltage until the difference between input and output voltages is reduced below the predetermined threshold value. In the above-mentioned application, there is the description of an implementation example where this function is performed automatically by a current generator inserted between the output terminal coupled to the load and the higher potential supply terminal. In fact, the current thus delivered to the load impedance makes it possible to obtain a sufficient voltage at the output terminal so that the comparator may cease to inhibit the transducer circuit's normal operation when the short circuit has been eliminated.

However, this method of obtaining an automatic switching back on of the circuit is counterproductive when the load impedance is AC coupled to the output terminal by means of a condenser. The threshold comparator can no longer be sensitive to a short circuit of the load downstream from the condenser, because the DC isolated transducer circuit output terminal, is kept at too high a potential by the current supplied by the current generator. If the current generator is omitted, the final stage's stray current can be theoretically sufficient, after removal of the short circuit, to bring the output terminal to the voltage enabling the transducer circuit to be restored to normal operation.

In practice, however, this restoration is not certain, or it happens with a delay that cannot be determined. A protection device of the type indicated above is also inefficient, independent of the presence or lack of circuit means for the automatic switching back on of the protected circuit, when a double supply is used and a load is DC connected between the output terminal and the ground potential, the ground potentials being intermediate between the potential of the two supply terminals furthermore a load, inserted between the output terminals of two transducer circuits that are in phase opposition in a bridge circuit arrangement and in which each transducer has a protection device of the kind just described, is not protected at all in the case of a short circuit at its end terminals.

SUMMARY OF THE INVENTION

The purpose of the present invention is to create a short circuit protection device for a unitary gain signal transducer circuit and for a load coupled to it. The operation of the short circuit protection device is limited to the short circuit conditions, requires negligible power dissipation by the protected device, and can be used without problems under any conditions of supply and transducer circuit/load coupling.

Such a goal is achieved with the short circuit protection device defined and characterized in the claims that conclude the present description.

According to one embodiment of the invention, a short circuit protection device is disclosed for a signal transducer circuit with a substantially unitary voltage gain under normal load conditions, having an input terminal for connection to a signal generator, an output terminal coupled to a load impedance and an inhibit terminal, comprising a first and a second threshold comparator, each comparator being equipped with a first and second input terminal and one output terminal. The first and second input terminals of the first comparator can be coupled respectively to the input terminal and to the output terminal of the transducer circuit and the first and second input terminals of the second comparator are connected to a first and second terminal of the load impedance. The threshold voltage of the first comparator is adjusted in such a way that this comparator generates an output signal when the difference between input and output voltages of the transducer circuit exceeds a predetermined value. The second comparator threshold voltage can be adjusted in such a way that the second comparator generates an output signal when the value of the voltage drop on the load impedance between the first and the second terminal exceeds a predetermined value. An actuator circuit (ACT) is provided with an activation terminal, a first and second output terminal and an inhibit terminal, the actuator circuit terminals being connected respectively to the output terminal of the first comparator, to the inhibit terminal of the signal transducer circuit, to the load impedance and to the output terminal of the second comparator. The actuator circuit includes current generating circuit means coupled to the second output terminal of the same actuator circuit, the value of the generated current being sufficient to cause a load impedance voltage drop greater than the predetermined threshold value of the second comparator coupled to it.

The invention will be better understood from the following detailed description, along with the drawings.

DESCRIPTION OF THE PREFERRED EMBODIMENT

Figure 1:
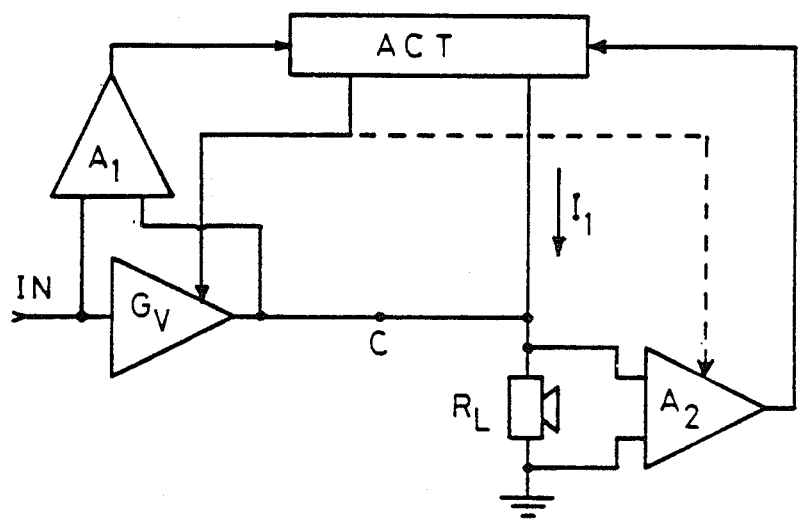
FIG. 1 is a block diagram of a signal transducer circuit with a protection device according to the present invention.

Referring to FIG. 1, a signal transducer circuit, shown as block $G_y$, is, for example, the final stage of a power amplifier built in such a way as to have unitary voltage gain under normal load conditions.

This transducer circuit has a signal input terminal IN, an output terminal C, which is coupled to a load impedance $R_L$, inserted between the output terminal and the ground, and an inhibit terminal. A threshold comparator $A_1$ has two input terminals connected respectively to the input and output terminals of the transducer circuit.

The comparator is capable of furnishing an output signal only when the difference between the voltages applied at its input terminals is greater than a predetermined threshold value. When operation is normal, the input and output terminals of transducer circuit $G_v$ are equipotential and therefore comparator $A_1$ does not furnish an output signal. But if the transducer output power is overloaded by a short circuit, the output voltage tends to decrease in relation to the input voltage until it satisfies the comparator threshold condition. The comparator then begins to furnish the output signal. The output signal of the threshold comparator $A_1$ is coupled to an activation terminal of an actuator circuit, the actuator circuit being represented in FIG. 1 by a block marked ACT. The actuator circuit has a first and a second output terminal coupled respectively to the transducer inhibit terminal and to the load impedance.

This actuator circuit, in the presence of the threshold comparator output signal, controls, through its own output terminals, the transducer's inhibition and, simultaneously, supplies a current $I_1$ to the load impedance $R_L$. The current $I_1$ then discharges to ground potential. A second threshold comparator, $A_2$, has two input terminals coupled to the ends of the load $R_L$ and an output terminal coupled to the actuator circuit inhibit terminal.

A dotted line (indicating that it is not indispensable for the proper operation of the protection device) shows a possible coupling between a third output terminal of the actuator circuit and an activation terminal of the threshold comparator $A_2$. The threshold comparator is enabled by this coupling to operate only in the presence of a signal at the output of threshold comparator $A_1$.

Comparator $A_2$ is also capable of furnishing an output signal, but only when the difference between the voltage applied across the input terminals, i.e. the voltage drop across the load impedance $R_L$, is greater than a predetermined threshold value. Under short circuit conditions, when no current or a negligible amount of it is flowing through the load impedance, comparator $A_2$ will not furnish a signal to the output terminal. As soon as the short circuit has been removed, because the voltage drop across the load impedance has now risen to a value higher than the threshold voltage, the comparator can furnish an output signal for the inhibition of the actuator circuit. As soon as the actuator circuit is deactivated, the signal transducer circuit is enabled to start operating again and, simultaneously, current flow $I_1$ to the load impedance is interrupted. The current flow, $I_1$, enables the comparator $A_2$, no matter how the load impedance is coupled to the circuit, to detect the short circuit's removal and, consequently, to obtain the automatic activation of the transducer circuit. Once the transducer circuit has started operating normally again, comparator $A_1$ also ceases to supply a signal at its output terminal.

In case the coupling indicated by the dotted line in FIG. 1 is present when actuator circuit operation is inhibited, the second comparator' $A_2$ is also deactivated, thus avoiding any absorption of supply power, however small. But if the causes of the short circuit are not removed, the signal transducer circuit is kept, by the actuator circuit, in the condition of being unable to start operating again, thus preventing any risk of damage.

In addition to the limited current dissipation due to the operation of the comparators and the actuator circuit, the only other dissipation is one relating to the current $I_1$, which is discharged to ground. Therefore, both total supply current dissipation and thermal dissipation of the circuit are very well controlled, even under short circuit conditions.

The problems known to arise with protection devices when the the load is AC coupled are not present. In fact, the automatic activation does not create any problems because the short circuit detecting circuit means are coupled directly to the ends of the load inpedance. For this same reason, the protection device works even in cases of double supply.

Figure 2:
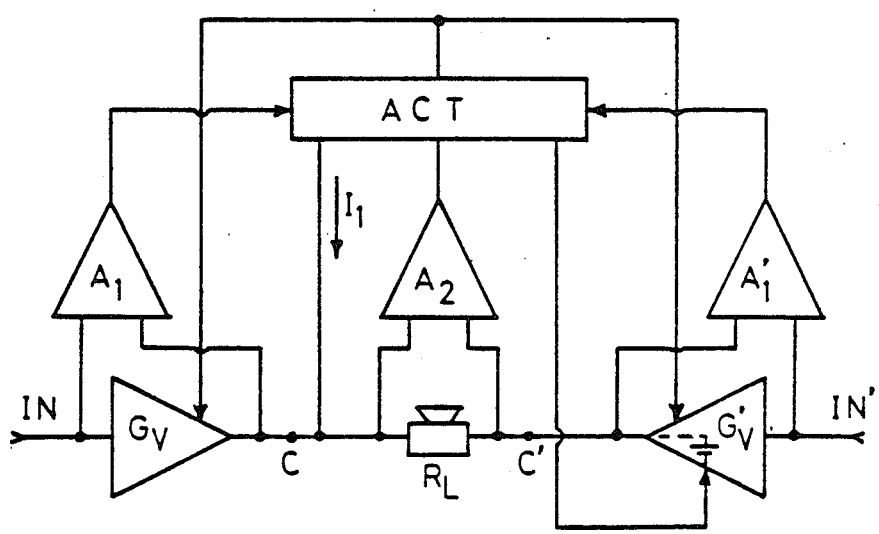
FIG. 2 is the block diagram of the final stage of a power amplifier containing two signal transducer circuits coupled to the load impedance according to a bridge circuit configuration and protected against short circuits by means of a protection device according to the present invention.

FIG. 2 shows the block diagram of a power amplifier's final stage. The final stage has a "bridge" configuration comprising two identical sections and each section with a protection device similar to the one shown in the drawing of FIG. 1.

Two blocks, designated by the letters $G_v$ and $G'_v$, represent two signal transducer circuits implemented in such a way as to have, under normal load conditions, a unitary voltage gain. The two signal transducer circuits each have an input terminal, IN and IN', an output terminal, C and C', and an inhibit terminal.

A load impedance $R_L$ is inserted between the output terminals C and C' of the two transducer circuits.

The input terminals of a threshold comparator are coupled to the input and output terminals of each transducer circuit.

Comparators $A_1$ and $A'_1$, coupled to transducer circuits $G_v$ and $G'_v$, are capable of supplying an output signal only when a difference between the voltages applied to the comparator input terminals is greater than a predetermined threshold value.

In this case also, when operation is normal, the input and output terminals of each transducer circuit are equipotential. Therefore comparators $A_1$ and $A'_1$ do not furnish any output signal. But if the output of one or both transducer circuits is overloaded because of a short circuit, the output voltage tends to become lower in relation to the input voltage until it satisfies the conditions for operation of the corresponding comparator, which, therefore, supplies an output signal.

The output terminals of both threshold comparators $A_1$ and $A'_1$ are coupled to an activation terminal of an actuator circuit, ACT. The actuator circuit has a first, a second, and a third output terminal and an inhibit terminal. The first output terminal is coupled to the inhibit terminals of the two transducer circuits; the second output terminal is coupled to a first terminal of the load impedance where it delivers a flow of current $I_1$. The third output terminal is coupled through transducer circuit $G'_v$ to the other terminal of the load impedance and becomes a voltage reference, indicated symbolically in the figure by the standard electrical voltage supply icon.

A third threshold comparator, $A_2$, has two input terminals coupled to the ends of load impedance $R_L$ and an output terminal coupled to the inhibit terminal of the actuator circuit, ACT. The comparator $A_2$ is capable of supplying an output signal only when both voltages applied to its inputs exceed a predetermined threshold value and the difference between these voltages, equal to the voltage drop $R_L \cdot I_1$ across the load impedance, is greater than a predetermined threshold value.

Under all short circuit conditions, either directly to the load impedance or between the output terminals and the ground potential, the comparator $A_2$ does not supply an output signal signal because, in the first case, the voltage drop across the load impedance is practically zero, while in the other case the voltage at the terminal of the load impedance affected by the short circuit is practically zero.

However, as soon as the causes of the short circuit are removed, the voltage drop across load impedance again exceeds the threshold value due to current $I_1$, and the potential voltage at either terminal of the load impedance becomes greater due to the voltage reference coupled to the load impedance causing comparator $A_2$ to supply an output signal.

The operation of the protection mechanism in FIG. 2 is identical, both overall and block by block, to the protection mechanism in FIG. 1, except that there a voltage reference is furnished by the ground potential itself. An efficient protection mechanism is therefore also guaranteed for this bridge structure, both to the load impedance and to the transducer circuits, with automatic switching back on under all conditions of load/circuit coupling.

Figure 3:
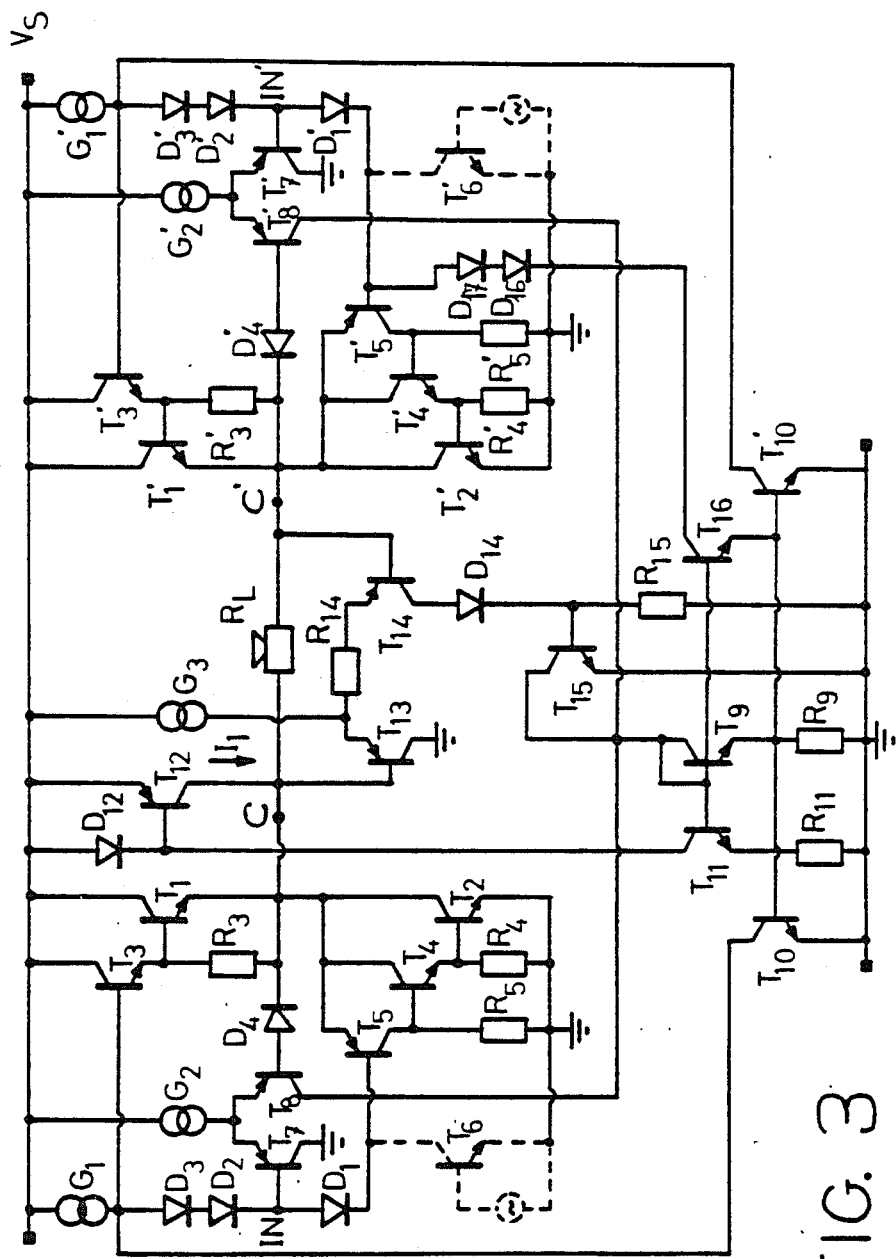
FIG. 3 represents a possible implementation of the block diagram of FIG. 2 by a monolithic integrated circuit.

FIG. 3 shows a particular circuit implemention of the block diagram in FIG. 2, incorporating a protection device against short circuits according to the present invention. The circuit shown is particularly well suited for implementation in monolithic integrated technology.

The signal transducer circuit contained within each of the two bridge sections is a typical final stage circuit of an AB class unitary voltage gain power amplifier. One of these transducer circuits will be described. The elements of the other circuit, identical to the first, are displayed in FIG. 3 with identical symbols, but with a prime associated therewith.

The transducer circuit contains two NPN power transistors $T_1$ and $T_2$, the first transistor coupled to the power supply, positive terminal $V_s$ and the second transistor coupled to the ground terminal by the transistor emitter, the ground terminal constituting the second terminal of the power supply.

The connection point between the emitter of $T_1$ and the collector of $T_2$ is the output terminal C of the transducer circuit, to which a first terminal of load impedance $R_L$ is coupled. The second terminal of the load impedance is coupled to the corresponding output terminal C' of the second transducer circuit.

The bases of transistors $T_1$ and $T_2$ are coupled respectively to the emitters of two other NPN transistors, $T_3$ and $T_4$, to which the emitters of transistors $T_1$ and $T_2$ are also coupled across two resistors, $R_3$ and $R_4$, respectively.

The collector and the emitter of a PNP transistor $T_5$, whose collector is coupled to the ground potential across a resistor $R_5$, are coupled respectively to the base and to the collector of transistor $T_4$.

The signal to be processed is supplied to the transducer circuit through an NPN transistor $T_6$, shown in FIG. 3 with a dotted line because it belongs to a separate device. The emitter of transistor $T_6$ is coupled to a terminal at ground potential. The collector is coupled both to the base of $T_5$ and, through a first diode $D_1$, a second diode $D_2$, and a third diode $D_3$ to the base of transistor $T_3$. The base of transistor $T_3$ is coupled to power supply $V_s$ by means of a constant current generator $G_1$. The point of connection between diodes $D_1$ and $D_2$ constitutes the transducer circuit input terminal, IN.

Threshold comparator $A_1$ is implemented by means of a differential circuit made up of two PNP transistors, indicated by transistors $T_7$ and $T_8$; emitters of transistors $T_7$ and $T_8$ are coupled together to the supply $V_s$ through a constant current generator $G_2$. The collector of $T_7$ is coupled directly to a terminal at ground potential.

The base of transistor $T_7$ is coupled to input terminal IN between diode $D_1$ and $D_2$ and the base of transistor $T_8$ is coupled across diode $D_4$ to the output terminal C.

The transducr is made in such a way that, during normal operation, nodes IN and C are equipotential. The differential circuit consisting of transistor $T_7$ and transistor $T_8$ is kept unbalanced by diode $D_4$ so that normally only transistor $T_7$ conducts or the conduction of transistor $T_8$ is negligible. The collector of transistor $T_8$ is coupled to the collector of an NPN transistor $T_9$, the collector of transistor $T_9$ being short circuited to its own base. The emitter of transistor $T_9$ is coupled to a terminal at ground potential across resistor $R_9$ and is also coupled to the bases of two NPN transistors, $T_{10}$ and $T'_{10}$. Emitters of transistors $T_{10}$ and $T_{11}$ are coupled to a terminal at ground potential and the collectors are coupled respectively to the base of transistor $T_3$, in the first section, and to the base of transistor $T'_3$, (corresponding to $T_3$), in the second section. The base of transistor $T_9$ is coupled to the base of an NPN transistor $T_{11}$. The emitter of transistor $T_{11}$ is coupled to a terminal at ground potential through a resistor $R_{11}$.

The collector of $T_{11}$ is coupled both to power supply $V_s$, across diode $D_{12}$, and to the base of an PNP transistor, $T_{12}$. The emitter of transistor $T_{12}$ is coupled to power supply $V_s$. The collector of transistor $T_{12}$ is coupled to the first terminal of the load impedance $R_L$ to which the collector furnishes a flow of current $I_1$. $T_9$, $T_{10}$, $T'_{10}$, $R_9$, $T_{11}$, $R_{11}$, $D_{12}$ and $T_{12}$ together make up the actuator circuit, ACT. $T_{10}$ and $T'_{10}$, in particular, constitute, with $R_9$, an electronic breaker controlled by the collector current of $T_8$ or $T'_8$.

Under short circuit conditions between terminal C or C' and a conductor at ground potential, or short circuit conditions on the load impedance itself, the collector current of transistors $T_8$ or $T'_8$ increases until it enables transistors $T_{10}$ and $T'_{10}$ to be switched on. The switching is the result of the operating conditions of differential circuits $T_7$, $T_8$ or $T'_7$, $T'_8$ due to the short circuit. Transistors $T_{10}$ and $T'_{10}$ then absorb all the current supplied by $G_1$ and $G'_1$, thereby switching off all the transistors of the two transducer circuits $G_y$ and $G'_y$.

Transistors $T_9$, $T_{11}$ and $T_{12}$, with resistor $R_{11}$ and diode $D_{12}$, constitutes a mirror current circuit that determines, simultaneously with transducer circuit inhibition, a current flow $I_1$ through the load impedance.

Threshold comparator $A_2$ is accomplished by means of a differential circuit comprising two PNP transistors, $T_{13}$ and $T_{14}$. Both the emitter of transistor $T_{13}$ and the emitter of transistor $T_{14}$ are coupled across resistor $R_{14}$ to power supply $V_s$ by means of a constant current generator $G_3$.

The bases of transistors $T_{13}$ and $T_{14}$ are coupled respectively to the first and second terminal of the load impedance, $R_L$.

The collector of transistor $T_{13}$ is coupled directly to the ground potential; the collector of $T_{14}$ is coupled to the anode of a diode $D_{14}$. The cathode of diode $D_{14}$ is coupled to a terminal at ground potential across a resistor $R_{15}$ and to the base of an NPN transistor $T_{15}$. The emitter of transistor $T_{15}$ is coupled to a terminal ground potential and the collector is coupled to the collector of $T_8$.

Transistors $T_{13}$ and $T_{14}$ consititute a differential circuit that, under normal operating conditions of the amplifier final stage, is kept unbalanced by resistor $R_{14}$, so that nearly all the current supplied by generator $G_3$ is absorbed by $T_{13}$; therefore the current of the collector of transistor $T_{14}$ is so low that it does not allow the conduction of transistor $T_{15}$; transistor $T_{15}$ also being included in the threshold comparator.

However, when the differential circuit is so biased that the current of the collector of transistor $T_{14}$ is sufficient to control the switching on of transistor $T_{15}$, the conduction level of this transistor is immediately such that it absorbs all the current of the collector of transistor $T_8$ and causes the switching off of transistor $T_9$ and the other transistors connected to it since there bases are no longer energized. Transistor $T_{15}$ therefore acts as an electronic breaker, controlled by a differential circuit including transistors $T_{13}$ and $T_{14}$ to inhibit the operation of the actuator circuit.

The actuator circuit includes another NPN transistor, $T_{16}$, whose base is also coupled to the base of transistor $T_9$. The emitter and the collector of transistor $T_{16}$ are coupled respectively to the emitter of transistor $T_9$ and, across two diodes, $D_{16}$ and $D_{17}$, coupled in series, to the base of transistor $T'_5$. Transistor $T'_5$ belongs to the second transducer circuit $G'_y$ and corresponds to $T_5$ in the second bridge section.

When, corresponding to a short circuit in the load impedance in the output connections of the transducer circuits, the actuator circuit is activated, transistor $T_{16}$ tends to bring, through transistor $T'_5$, the output terminal C' of the second transducer circuit $G'_y$ to a suitable reference potential capable of biasing $T_{14}$ and $T_{15}$ to a conducting state.

If the short circuit is between terminal C and ground potential, $T_{14}$ and $T_{15}$ cannot conduct until the short circuit is removed. Then current $I_1$, which was flowing directly to a conductor at circuit ground potential, causes a rise in the potential voltage of terminal C because of the voltage drop across the load impedance relative to node C', node C' being maintained at the reference potential by $T_{16}$. The rise of the potential voltage is such that it enables primarily the conduction of $T_{14}$, which causes transistor $T_{15}$ to be in a conductive state, thereby switching off the actuator circuit.

When the short circuit is between the terminal C' and the ground, C' is kept at ground potential in spite of the voltage reference. Therefore, transistor $T_{15}$ remains in a condition of bias that will not permit conduction. As soon as the short circuit is removed, transistor $T_{15}$, in this case also, is brought to conduction and switches off the actuator circuit.

Also during a short circuit directly between the ends of load impedance $R_L$, transistor $T_{15}$ is kept in a nonconductive state because the differential circuit input terminals are equipotential and are at the reference potential determined by means of transistor $T_{16}$. Therefore, transistor $T_{13}$ conducts most of the current in the differential circuit. As in the previous cases, when the short circuit is removed, the voltage drop on the load due to current $I_1$ causes transistor $T_{14}$ to conduct and also, consequently, transistor $T_{15}$ will conduct, which switches off the actuator circuit.

The threshold comparator $A_2$, comprising transistors $T_{13}$, $T_{14}$ and $T_{15}$, can be defined in its circuit implementation as "not compatible at ground". Because when one or both of its input terminals are at ground potential, the threshold comparator cannot furnish any output signal.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A short circuit protection device for a signal transducer circuit ($G_v$) with a substantially unitary voltage gain under normal load conditions, having an input terminal for connection to a signal generator, an output terminal coupled to a load impedance ($R_L$), and an inhibit terminal, comprising:

a first ($A_1$) and a second ($A_2$) threshold comparator, each of said comparators equipped with a first and second input terminal and an output terminal, said first any said second input terminals of said first comparator ($A_1$) being coupled respectively to said input terminal and to said output terminal of said transducer circuit ($G_v$), said first annd said second input terminals of said second comparator ($A_2$) being connected to a first and second terminal of said load impedance ($R_L$), a threshold voltage of said first comparator ($A_1$) being adjusted in such a way that said first comparator generates a signal at said output terminal of said first comparator when a difference between an input and an output voltage of said transducer circuit ($G_v$) exceeds a first predetermined value, a threshold voltage of said second comparator beng selected so that said second comparator ($A_2$) generates a signal at said second comparator output terminal when a value of voltage drop across said load impedance ($R_L$) between said first and second terminals exceeds a second predetermined value;

an actuator circuit (ACT) including an activation terminal, a first output terminal, a second output terminal and an inhibit terminal, said actuator terminals being coupled respectively to said output terminal of said first comparator ($A_1$), to said inhibit terminal of said signal transducer circuit ($G_v$), to said load impedance ($R_L$), and to said output terminal of said second comparator ($A_2$), said actuator circuit further including current generating circuit means coupled to said second output terminal of said actuator circuit, a value of generated current being selected to cause a voltage drop across said load impedance greater than said second predetermined threshold value of the second comparator ($A_2$).

2. The short circuit protection device of claim 1, wherein said second threshold comparator ($A_2$) has an activation terminal coupled to said first output terminal of the actuator circuit.

3. The short circuit protection device of claim 1, wherein said signal transducer circuit ($G_v$) is a final stage of a power amplifier, said first comparator ($A_1$) containing a first differential circuit having input terminals coupled respectively to said input terminal and said output terminal of said signal transducer circuit, said first comparator having circuit means capable of biasing said input terminals of said differential circuit so that a first of said differential circuit input terminals which is coupled to said signal transducer circuit output terminal has a potential voltage exceeding a potential voltage of a second of said input terminals by at least said predetermined threshold value during said amplifier normal operation, an output terminal of said differential circuit being coupled to said actuator circuit activation terminal, said second comparator ($A_2$) containing a second differential circuit, having input terminals coupled respectively to a first and a second terminal of said load impedance, and circuit means capable of biasing said input terminals of said second differential circuit, so that said input terminals are at potential voltage levels which differ from each other by at least said second predetermined threshold value during normal operation of said amplifier, and said second comparator further including an electronic breaker coupled to said inhibit terminal of said actuator circuit (ACT) and controlled by an output of the second differential circuit; the said actuator circuit (ACT) also including an electronic breaker controlled by an output signal of said first differential circuit and coupled to said inhibit terminal of said signal transducer circuit ($G_v$), said inhibit terminal being coupled to a point in a path of signal transducer circuit signals, wherein said current generating circuit means include a mirror current amplifier circuit, an input signal of said mirror current amplifier being coupled to said first differential circuit output terminal, and an output terminal of said mirror current amplifier being coupled to said load impedance.

4. A short circuit protection device for a circuit including a first ($G_v$) signal transducer and a second ($G'_v$) signal transducer circuit, both said first signal transducer circuit and said second signal transducer circuit having a substantially unitary voltage gain under normal load conditions, each of said transducer circuits having an input terminal, an output terminal and an inhibit terminal; said transducer circuits operating in phase opposition; a load impedance with a first and a second terminal coupled by means of said first and second terminals respectively to said first transducer circuit output terminal and to said second transducer circuit output terminal, comprising:

a first ($A_1$), a second ($A'_1$) and a third ($A_2$) threshold comparator, each of said comparators including a first and a second input terminal and an output terminal, said first and said second input terminals of said first comparator ($A_1$) being coupled respectively to said input terminal and said output terminal of said first transducer circuit ($G_v$), said first and said second input terminals of said second comparator ($A'_1$) being coupled respectively to said input terminal and to said output terminal of said second transducer circuit ($G'_v$), said first, and said second input terminals of said third comparator ($A_2$) being coupled respectively to said first and said second terminals of said load impedance ($R_L$), a threshold voltage of said first comparator ($A_1$)

and a threshold voltage of said second comparator ($A'_1$) being adjusted so that said first and said second comparators generate signals respectively at said output terminals when a difference between an input voltage and an output voltage of one of said transducer circuits to which said comparator is coupled exceeds a first predetermined value, a threshold of said third comparator ($A_2$) being selected to generate a signal at said third comparator output terminal when voltage at each of said first input terminal of said third comparator and said second input terminal of said third comparator are greater than a second predetermined value and a voltage across said load impedance between said first and said second terminals exceeds a third predetermined value; and an actuator circuit (ACT) having an activation terminal, a first and second output terminal and an inhibit terminal, said activation terminal being coupled to said output terminals of said first ($A_1$) and said second ($A'_1$) comparator, said first actuator output terminal being coupled to said inhibit terminals of both of said transducer circuits ($G_v$ and $G'_v$), said second actuator output terminal being coupled to said first terminal of said load impedance ($R_L$), said actuator inhibit terminal being coupled to said output terminal of said third comparator ($A_2$), said actuator circuit including current generating circuit means coupled to said second output terminal of said actuator circuit, a value of current generated being selected to produce a voltage drop across said load greater than said third predetermined threshold value of said third comparator ($A_2$), said actuator circuit also including circuit means capable of producing a voltage reference coupled to the second terminal of said load impedance ($R_L$).

5. The short circuit protection device of claim 4, wherein said protected circuit is a final stage of a power amplifier, said power amplifier including circuits having a bridge configuration, wherein said third comparator ($A_2$) includes a differential circuit ($T_{13}$, $T_{14}$), having input terminals respectively connected to the first and to the second load terminal, an electronic breaker connected to said inhibit terminal of said actuator circuit and controlled by an output of said differential circuit ($T_{13}$, $T_{14}$), and circuit means capable of biasing said differential circuits ($T_{13}$, $T_{14}$), an output signal being produced only when said input terminals of said differential circuit have potential voltages that differ by at least said third predetermined value, said third comparator generating a signal on said output terminal of said third comparator only if both said first input terminal of said third comparator and said second input terminal of said third comparator exceed said second predetermined threshold voltage.

6. A amplifier protection circuit for protection of an amplifier circuit, wherein said amplifier has a terminal for disabling said amplifier from energizing a load impedance, said amplifier protection circuit comprising:

first means coupled between an input and output terminal of said amplifier for producing a first output signal when a voltage between said input and said output terminals exceeds a predetermined value;

second means coupled across said load impedance for producing a second output signal when a voltage across said load impedance exceeds a pre-established value; and third means for deactivating said amplifier and applying a current to said load impedance in response to said first output signal, said third means activating said amplifier and halting said current in response to said second output signal.

7. The amplifier protection circuit of claim 6 wherein said third means activates said second means in response to said first output signal.

8. The amplifier protection circuit of claim 6 wherein said load impedance is also energized by a second amplifier, said amplifier protection circuit further comprising:

fourth means coupled across between an input and an output terminal of said second amplifier for producing a third output signal when a voltage between said input and output terminals of said second amplifier exceeds a preselected value, said third output signal causing said third means to deactivate said amplifier and said second amplifier while applying said current to said load impedance, said first output signal also deactivating said second amplifier, said third means also activating said second amplifier in response to said second output signal.

9. The amplifier protection circuit of claim 8 wherein said amplifier, said second amplifier, said first means, said second means, said third means and said fourth means are monolithically integrated in a semiconductor element.

10. The amplifier protection circuit of claim 6 wherein said amplifier, said first means, said second means and said third means are monolithically integrated in a semiconductor element.

11. The amplifier protection circuit of claim 6 wherein said amplifier is a unitary voltage gain signal transducer circuit.

12. The method of protecting an amplifier circuit driving a load impedance comprising the step of;

deactivating said amplifier circuit and applying a preselected current to said load impedance in response to a first amplifier condition; and activating said amplifier circuit and halting said current in response to a first impedance condition.

13. The method of protecting an amplifier circuit driving a load impedance comprising the steps of:

deactivating said amplifier circuit when a test voltage across an input terminal and an output terminal of said amplifier exceeds a pre-established value;

applying a pre-selected current to said load impedance when said test voltage exceeds said pre-established value;

removing said pre-selected current when a voltage across said load impedance exceeds a predetermined value; and activating said amplifier circuit when said impedance voltage exceeds said predetermined valve.

14. The method of protecting an amplifier circuit of claim 13 wherein said deactivating step further includes the step of enabling an actuator circuit when said test voltage exceeds said pre-establishing value and wherein said removing step further includes the step of disabling said actuator circuit when said impedance voltage exeeds said pre-established value, said actuator circuit controlling said current and said amplifier.

15. A protection circuit for protecting an amplifier, said amplifier for energizing a load impedance comprising:
- actuator means coupled to said amplifier and to said load impedance, said actuator means having a first state for disabling said amplifier and for applying a specified current to said load impedance, said actuator means having a second state for enabling said amplifier and halting said specified current;
- first means for sensing a predetermined condition of said amplifier, said first means causing said actuator means to change from said second state to said first state in response to said predetermined condition; and
- second means for sensing a pre-established condition in said load impedance, said second means causing said actuator means to change from said first state to said second state in repsonse to said pre-established condition.

16. The protection circuit of claim 15 wherein said amplifier is a unitary voltage gain signal transducer.

17. The protection circuit of claim 15 wherein a second amplifier also energizes said load impedance, said actuator disabling said second amplifier when said actuator is in said first state, said actuator enabling said second amplifier when said actuator is in said second state, said protection circuit further comprising:

third means for sensing a selected condition for said second amplifier, said third means causing said actuator means to change from said second state to said first state in response to said selected condition.

18. The protection circuit of claim 15 wherein said actuator means enables said second means in said first state.

19. The protection circuit of claim 15 wherein said protection circuit and said amplifier are monolithically integrated in a semiconductor substrate.

20. The method of protecting an amplifier circuit energizing a load impedance against a load impedance short circuit condition comprising the steps of:
- identifying said short circuit condition by operating parameters of said amplifier;
- disabling said amplifier when said short circuit condition is identified;
- energizing said load impedance with a pre-selected energy source when said short circuit condition is identified;
- identifying a removal of said short circuit condition by said parameters of said load impedance;
- disabling said pre-selected energy source when said short circuit condition removal is identified; and
- enabling said amplifier when said short circuit condition removal is identified.

* * * * *

UNITED STATES PATENT AND TRADEMARK OFFICE
CERTIFICATE OF CORRECTION

PATENT NO. : 4,682,120
DATED : July 21, 1987
INVENTOR(S) : Sergio Palara and Aldo Torazzina It is certified that error appears in the above-identified patent and that said Letters Patent is hereby corrected as shown below:

In Claim 1, Column 9, Line 36, change "annd" to --and--.

In Claim 1, Column 9, Line 46, change "beng" to --being--.

In Claim 13, Column 12, Line 60, change "valve" to --value--.

Signed and Sealed this

Seventeenth Day of November, 1987

Attest:

DONALD J. QUIGG

Attesting Officer

Commissioner of Patents and Trademarks